United States Patent [19]

Day et al.

[11] Patent Number: 4,477,552

[45] Date of Patent: Oct. 16, 1984

[54] STABILIZATION OF DIAZO-RESIN SENSITIZERS WITH POLYVINYL PYRIDINE

[75] Inventors: Peter M. G. Day; John W. Jones, both of Wantage; John A. Sperry, Abingdon, all of England

[73] Assignee: Autotype International Limited, Wantage, England

[21] Appl. No.: 437,195

[22] Filed: Oct. 28, 1982

[30] Foreign Application Priority Data

Jan. 12, 1982 [GB] United Kingdom ............... 8200746

[51] Int. Cl.$^3$ .................. G03C 1/60; G03F 7/08; G03F 7/12
[52] U.S. Cl. .................................. 430/175; 430/141; 430/145; 430/176; 430/308; 430/325
[58] Field of Search .............. 430/175, 176, 308, 141, 430/145, 325

[56] References Cited

U.S. PATENT DOCUMENTS

| | | | |
|---|---|---|---|
| 2,937,085 | 5/1960 | Seven et al. | 430/176 |
| 3,143,423 | 8/1964 | Reynolds et al. | 430/325 |
| 3,853,561 | 12/1974 | Reichel | 430/308 |
| 4,092,170 | 5/1978 | Houtermans et al. | 430/175 |
| 4,245,027 | 1/1981 | Takeda et al. | 430/141 |
| 4,247,615 | 1/1981 | McGuckin et al. | 430/175 |

FOREIGN PATENT DOCUMENTS

| | | | |
|---|---|---|---|
| 51-6530 | 1/1976 | Japan | 430/176 |
| 54-3726 | 2/1979 | Japan | 430/176 |

OTHER PUBLICATIONS

Kosar, J., "Light-Sensitive Systems", J. Wiley & Sons, 1965, pp. 321-326.

*Primary Examiner*—Charles L. Bowers
*Attorney, Agent, or Firm*—Young & Thompson

[57] ABSTRACT

Light-sensitive compositions and materials incorporating such compositions, such as coated films for the production of polymeric resists, comprise a diazo-resin as a sensitizer for the composition and a water-soluble or water-dispersible colloid. In order to stabilize the diazo-resin sensitizer and increase the time between manufacture and use of such light-sensitive compositions and material, a poly-(vinylpyridine) is incorporated in the composition, preferably in the form of a water-soluble salt such as the hydrochloride or sulphate.

12 Claims, No Drawings

STABILIZATION OF DIAZO-RESIN SENSITIZERS WITH POLYVINYL PYRIDINE

DESCRIPTION

This invention relates to light-sensitive substances and to light-sensitive compositions and materials containing them and is particularly concerned with those substances which are commonly called "diazo-resins". These substances are prepared by the condensation of an aromatic diazonium compound with a compound containing a reactive carbonyl group. Their molecular structure includes a hydrophilic diazonium group attached to an aromatic ring. Diazo-resins are of interest, because exposure to actinic light causes removal of the diazonium group from the ring, which in turn causes the exposed resin to become hydrophobic. Also, if a polymer is mixed with the diazonium compound, the active sites formed during exposure can cause cross-linking of the polymer.

A diazo-resin can be formed into a solution with a solvent, the resin being used either alone or, as is more usual, in admixture with a cross-linkable polymer, and the solution can then be coated upon a support as a thin layer, the solvent then being removed. Imagewise exposure of the resultant coated product can render the exposed portions insoluble in the solvent. Diazo-resins are usually available commercially in the form of salts of inorganic acids, e.g. hydrohalides, sulphates, phosphates or zinc chloride double-salts. These inorganic salts of diazo-resins are readily water-soluble and this makes them usable as sensitizers in photo-sensitive compositions which can be washed out, after exposure, with water.

The use of diazo-resin salts in litho platemaking is described, for example, in GB-A-1,108,560, 1,312,925 and 1,312, 926 and in U.S. Pat. No. 3,235,384. On exposure to actinic light, the light-struck areas on a coated litho plate become insoluble, so that removal of the unexposed areas by solvent processing bares the hydrophilic surface of the underlying plate. By moistening these hydrophilic areas and inking the hydrophobic areas of the exposed resin image, the plate may be used as a printing forme.

Water-soluble diazo-resins may also be used in conjunction with suitable polymeric materials to prepare screen-printing resists, as described in GB-A-941,962 and 1,312,926, for instance; GB-A-1,017,445 discloses that the zinc chloride double-salts of diazo resins are not suitable for this application. For convenience, the polymeric material employed is usually selected from those which are also water-soluble or water-dispersible, so that the subsequent processing step may be carried out using water alone. The resist can be applied in a number of ways to a mesh support, for the subsequent printing operation. For example, an aqueous dispersion of the diazo-resin-containing colloid mixture may be applied directly to the mesh, which is then dried, exposed to actinic light through a photographic positive and then processed by washing with water. This removes the unexposed and therefore unhardened areas of the colloid coating and, on drying, open areas are left in the mesh through which printing ink can be forced by the action of a squeegee during the printing process. Alternatively, the sensitized emulsion may be coated on to a temporary support and either transferred to a moistened mesh before processing or processed in situ on the temporary support. The resultant wet developed image is transferred to the printing mesh and dried and the temporary support is then removed.

Diazo-resins are somewhat thermally-sensitive and, in the presence of water, they deteriorate quite quickly. In litho plate-making, this disadvantage can be alleviated by converting the diazo-resin to an addition product which has a limited solubility in water. For example, U.S. Pat. No. 3,300,309 describes the use of phenolic compounds as reactants for this purpose, while GB-A-944,276 describes the preparation of the para-toluene sulphonate and GB-A-1,312,925 and 1,312,926 describe the co-condensation of hydrophobic aromatic compounds during the preparation of these resins.

Where the use of compounds having limited water-solubility is not possible or desirable, for example, when coatings are made from aqueous solutions and subsequent water-processing is required, it is difficult to prolong the shelf life adequately, because of the presence of the water. Products which have been coated from water, although nominally dry, may still contain traces of entrapped moisture or they may pick up moisture when exposed to the atmosphere, for instance, during manufacture, so that their shelf life is seriously reduced.

For this reason, commercially-available products for preparing screens by the direct method usually separate the aqueous colloid dispersion and the diazo-resin sensitizer. It is therefore necessary for the sensitizer to be mixed with the colloid dispersion shortly before use. The resultant mixture has a shelf life of only a few days or weeks.

It is well-known that shelf life can be increased to some extent by the addition of acids, which may either be mineral acids, e.g. phosphoric or sulphuric acid, or organic acids, e.g. citric or tartaric acid; H. K. Saunders in "The Aromatic Diazo Compounds", page 85, refers to the use of sulphonic acids, for example, naphthalene-trisulphonic acid, for this purpose. These acid compounds have the disadvantage that the amount needed to give the desired result is so large that the photographic properties of the material are adversely affected. The sensitizer becomes less sensitive to actinic light and less effective in hardening exposed areas of the coating. It can thus be seen that diazo-resins are useful compounds especially for the purposes mentioned, but their use is subject to various difficulties and disadvantages. It would be a considerable advantage to stabilise diazo-resins so that light-sensitive compositions containing them retain their desirable properties and also have improved shelf life.

It has unexpectedly been discovered, according to this invention, that diazo-resins may be stabilized by means of polymeric forms of vinylpyridine.

According to the present invention, a light-sensitive composition comprises an aqueous dispersion of a water-soluble or water-dispersible colloid and a water-soluble light-sensitive diazo-resin condensation product of an aromatic diazonium compound and a compound containing an active carbonyl group and this composition is characterised by containing as a stabiliser for the diazo-resin condensation product a linear polymer of vinylpyridine.

Preferably, the stabiliser used is a linear poly-(vinylpyridine) having a molecular weight in the range from 2,000 to 200,000.

The invention is preferably carried out by incorporating the vinylpyridine polymer in the light-sensitive composition containing the diazo-resin condensation product in an amount which is at least equal in weight to the amount of diazo-resin sensitizer present. The compositions are typically in conventional form, such as aqueous coating solutions or dispersions. In carrying out the invention, it has proved that the addition of a low percentage of polyvinylpyridine improves the keeping properties of diazo-resin sensitizer compositions although the preferred amount is 100%–300% by weight of the amount of the diazo-resin sensitizer.

Both poly-2-vinyl-pyridine and poly-4-vinylpyridine are suitable for use in carrying out the invention. These are usually in the form of linear polymers having a molecular weight in the range from 2,000 to 200,000. Before addition to the coating emulsion, the poly-(vinylpyridine) selected is preferably converted into a soluble salt by the addition of an acid, for example, hydrochloric acid or sulphuric acid. The acid may be the same as or different from that used to form the anion associated with the diazo-resin per se.

The invention also consists in a material for the production of a polymeric resist, which comprises a base or support e.g. a film, coated with a light-sensitive composition in the form of an emulsion of the invention as just described. Preferably, the poly-(vinylpyridine) is advantageously present in the material in the form of an acid addition salt.

As indicated above, the amount of poly-(vinylpyridine) used is preferably in the range from 100% to 300% by weight of the diazo-resin present. No adverse effects are produced by adding even larger quantities, but it does not appear that the stability is further improved by the use of such increased amounts.

Unlike the known use of stabilizing acids mentioned above, the addition of poly-(vinylpyridine) had no adverse effect on the photographic speed or efficiency of hardening of coatings containing the diazo-resin, when such coatings are exposed to actinic light. An important advantage of the invention is that the shelf life of aqueous dispersions or coatings containing a diazo-resin and poly-(vinylpyridine) is considerably enhanced over that of dispersions or coatings which do not contain the stabilizer of this invention.

As well as providing a suitable material for the preparation of printing screens, compositions prepared in accordance with the invention may be used for many other applications involving a resist image on a film support.

Suitable water-soluble colloids include polyvinyl alcohol, gelatin, casein, hydroxyethylcellulose, polyacrylamide and polyvinylpyrrolidone. Aqueous dispersions of water-insoluble polymers, such as poly(vinyl-acetate), or co-polymers of vinyl-acetate with ethylene, for instance, may also be included, such as are often added to emulsions for use in screen-printing processes. Coating compositions containing a stabilized diazo-resin component according to the invention may also include dyes or pigments in order to render the coating and the subsequent image visible.

The diazo compounds used preferably are derivatives of diazodiphenylamine and substituted diphenylamines, e.g. those having substituents in one or both phenyl rings, selected from alkoxy groups, for instance methoxy, ethoxy or propoxy groups, carboxy or nitro groups and halogen substituents, for instance chlorine or bromine atoms. The diazodiphenylamine may be reacted with one or more aldehydes, such as formaldehyde or acetaldehyde. Also, other aromatic compounds which do not contain a diazo group may be co-reacted, which however are capable of condensing in at least one position with a carbonyl group of an active carbonyl compound in an acid medium. Such compounds include diphenyl-ether, diphenyl-sulphide and diphenyl-methane. The reactants are usually condensed under acid conditions and the resultant diazo-resin is preferably isolated as a salt, such as the chloride, bromide, sulphate, methanesulphonate, phosphate or zinc chloride salt. Metal-free salts, such as the sulphate, phosphate or their mixtures, are of particular utility in connection with screen-printing processes.

In order that the invention may be fully understood, the following specific Examples are given, by way of illustration of various forms of compositions and materials according to the invention. In the Examples, amounts are given in parts by weight unless otherwise indicated. Examples 1 and 5 are given for comparison purposes and relate to a diazo-resin composition which does not include a stabilizer for the diazo-resin sensitizer, whereas the remaining Examples relate to the same composition containing various amounts of stabilizer of the invention.

EXAMPLE 1

25.0 parts of "Vinamul" 8440 ("Vinamul" is a Registered Trademark of Vinyl Products Limited), an emulsion of vinyl-acetate homopolymer containing 55% solids, was stirred into 51.0 parts of a 15% aqueous solution of "Poval" 224 ("Poval" is a Registered Trademark of Honeywill & Stein), an 88% hydrolysed grade of polyvinyl alcohol.

0.2 part of "Colanyl Green GG3", ("Colanyl" is a Registered Trademark of Farbwerke Hoechst AG), a high-strength pigment dispersion was added to 23.4 parts of water. The mixture of "Vinamul" 8440 and "Poval" 224 was added to the diluted pigment dispersion and vigorously stirred to give a homogeneous mix. 0.6 part of P1004, a diazo-resin marked by PCAS, Longjumeau, France, comprising a condensation product of diazophenylamine and formaldehyde prepared as the sulphate salt, was stirred into the above mix until fully dissolved. The pH of the composition was adjusted to 3.5, using sulphuric acid.

The resulting pigmented diazo-resin was stored in a sealed container at 40° C. and, periodically, samples of the emulsion were taken from the container and coated upon a screen consisting of monofilament polyester mesh at 90 threads per cm. The emulsion was dried, using a warm air fan, and the coated screen was then exposed through a photographic positive to actinic light provided by a 5 kw metal halide lamp at 1 meter distance. The exposure time was 2 minutes.

The resist was then sprayed with water and its ability both to become water-insoluble under U.V. radiation and to remain water-soluble in the unexposed areas was noted. Unexposed areas of the exposed screen made and treated in this way had undergone insolubilization after 25 days, due to instability of the light-sensitive material.

EXAMPLE 2

A 15% solution of poly-2-vinylpyridine in the form of a linear polymer of m.w. 2,000–20,000 was prepared by dispersing the solid polymer in water, followed by the addition of sulphuric acid until a constant pH of 3.4 was achieved. This polyvinylpyridine dispersion was then added to a quantity of the pigmented diazo-resin emulsion described in Example 1 to serve as a stabiliser for the diazo-resin, the amounts used being such that 1.5 parts of poly-2-vinylpyridine were present per 1 part of diazo-resin. The pH was again adjusted to 3.5.

The emulsion produced thus contained an amount of the stabilizer equivalent to 150% by weight of the amount of diazo-resin present. A quantity of the resultant emulsion, containing the poly-2-vinylpyridine was then coated upon a screen, dried, exposed and water-washed, in the same way as that described in Example 1. The screen prepared in this way, in contrast to that of Example 1, was still giving good water-solubility after 80 days, thus having more than 3 times the shelf life of screens prepared from a composition which is identical except for the absence of the stabilizer of the invention.

EXAMPLE 3

Example 2 was repeated with the exception that a greater quantity of the stabilizer was used, so that the coating emulsion contained twice the proportion of Example 2, namely 3 parts of poly-2-vinylpyridine per 1 part of diazo-resin or 300% by weight. Again, the exposed product was still giving good water-solubility after 80 days.

EXAMPLE 4

In order to ascertain whether an even higher proportion of stabilizer gave even better results, Example 2 was repeated again, with the exception that the amount of stabilizer used was such as to give 8 parts of poly-2-vinylpyridine per 1 part of diazo-resin or 800% by weight. The same results were given as in the two previous Examples, indicating that the highly satisfactory results obtainable can be achieved with the lower proportions of stabilizer to diazo-resin given in Examples 2 and 3.

EXAMPLES 5 to 8

The coating compositions described in Examples 1 to 4 respectively were employed in the manufacture of coated polyester film. A quantity of each composition was coated by means of wire-wound rods on to polyester film ("Melinex" S type, ("Melinex" is a Registered Trademark of ICI Limited) 0.075 micron or $7.5 \times 10^{-5}$ mm) to give two thicknesses in each case, namely 5 microns ($5 \times 10^{-3}$ mm) and 30 microns ($3 \times 10^{-2}$ mm). The coatings were dried at a temperature not exceeding 40° C. to give a final moisture content of 5%. Samples of the coated films were then wrapped and placed in ovens at 50° and 40° C. At daily intervals, samples of film from each were examined. In each case, the resist was exposed to actinic light for 1 minute as detailed in Example 1 and the ability of the unexposed areas of coating to remain water-soluble was assessed. The results were as follows:

| EXAMPLE | 30μ FILM | | 5μ FILM | |
|---|---|---|---|---|
| | 50° C. | 40° C. | 50° C. | 40° C. |
| 5 | 24 hrs | 1 day | 2 days | 7 days |
| 6 | 7 days | 8 days | 14 days | 80 days |
| 7 | 7 days | 14 days | 14 days | 80 days |
| 8 | 7 days | 14 days | 21 days | 80 days |

The results obtained confirm that films containing poly-(vinylpyridine) have greatly increased shelf-life in comparison with material prepared without using poly-(vinylpyridine), as shown by Example 5, in comparison with any of Examples 6 to 8.

We claim:
1. In a light-sensitive film-forming composition comprising in admixture an aqueous dispersion of a water-soluble or water-dispersible colloid selected from the group consisting of polyvinyl alcohol, gelatin, casein, hydroxyethylcellulose, polyacrylamide, polyvinylpyrrolidone, poly(vinyl-acetate), and copolymer of vinyl-acetate with ethylene present in a film-forming amount, and a water-soluble light-sensitive diazo-resin condensation product of an aromatic diazonium compound and a compound containing an active carbonyl group, present in an amount effective to decrease the solubility of the film upon exposure to light; the improvement in which the composition contains, as a stabilizer for the diazo-resin condensation product, a linear polymer of vinyl-pyridine in an amount effective to delay deterioration of said product in the presence of water.

2. A composition according to claim 1, wherein the stabilizer is a linear poly-(vinylpyridine) having a molecular weight in the range from 2,000 to 200,000.

3. A composition according to claim 1, wherein the poly-(vinylpyridine) is present in an amount which is at least equal in weight to the amount of diazo-resin present.

4. A composition according to claim 3, wherein the poly-(vinylpyridine) is present in an amount in the range from 100% to 300% by weight of the diazo-resin present.

5. A composition according to claim 1, wherein the poly-(vinylpyridine) is present in the form of a soluble salt of an acid.

6. A composition according to claim 2, wherein said molecular weight is in the range from 2,000 to 20,000.

7. In a material for use in the production of a polymeric resist, which comprises a supporting substrate carrying a coating of a light-sensitive composition comprising in admixture a water-soluble or water-dispersible colloid selected from the group consisting of polyvinyl alcohol, gelatin, casein, hydroxyethylcellulose, polyacrylamide, polyvinylpyrrolidone, poly(vinyl-acetate), and copolymers of vinyl-acetate with ethylene present in a film-forming amount, and a water-soluble light-sensitive diazo-resin, the diazo-resin comprising the condensation product of an aromatic diazonium compound and a compound containing an active carbonyl compound, present in an amount effective to decrease the solubility of the film upon exposure to light; the improvement in which the coating also contains, as a stabilizer for the diazo-resin, a linear poly-(vinylpyridine) in an amount effective to delay deterioration of said product in the presence of water.

8. A material according to claim 7, wherein the stabilizer is a linear poly-(vinylpyridine) having a molecular weight in the range from 2,000 to 200,000.

9. A material according to claim 7, wherein the poly-(vinylpyridine) is present in an amount which is at least equal in weight to the amount of diazo-resin present.

10. A material according to claim 9, wherein the poly-(vinylpyridine) is present in an amount in the range from 100% to 300% by weight of the diazo-resin present.

11. A material according to claim 7, wherein the poly-(vinylpyridine) is present in the form of a soluble salt of an acid.

12. A material according to claim 8, wherein said molecular weight is in the range from 2,000 to 20,000.

* * * * *